(12) United States Patent
Hu

(10) Patent No.: US 6,614,116 B1
(45) Date of Patent: Sep. 2, 2003

(54) BURIED DIGIT LINE STACK AND PROCESS FOR MAKING SAME

(75) Inventor: Y. Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/163,289

(22) Filed: Jun. 4, 2002

(51) Int. Cl.⁷ ............................................. H01L 21/461
(52) U.S. Cl. ........................ 257/751; 257/754; 257/763
(58) Field of Search ................................ 257/751, 754, 257/755, 763, 768

(56) References Cited

U.S. PATENT DOCUMENTS

| | | | |
|---|---|---|---|
| 5,392,189 A | * | 2/1995 | Fazan et al. ............. 3611/305 |
| 5,717,250 A | * | 2/1998 | Schuele et al. ............. 257/754 |
| 5,892,254 A | * | 4/1999 | Park et al. .................. 257/295 |
| 6,162,671 A | * | 12/2000 | Lee et al. ................... 438/238 |
| 6,455,424 B1 | * | 9/2002 | McTeer et al. ............. 438/675 |
| 6,531,730 B2 | * | 3/2003 | Sandhu et al. ............. 257/310 |

* cited by examiner

*Primary Examiner*—T. N. Quach
(74) *Attorney, Agent, or Firm*—Schwegman, Lundberg, Woessner & Kluth, P.A.

(57) ABSTRACT

A process of making a buried digit line stack is disclosed. The process includes forming a silicon-lean metal silicide first film over a polysilicon plug, followed by a silicide compound barrier second film. The silicide compound barrier second film is covered with a refractory metal third film. A salicidation process causes the first film to salicide with the polysilicon plug. In one embodiment, all the aforementioned deposition processes are carried out by physical vapor deposition ("PVD").

27 Claims, 7 Drawing Sheets

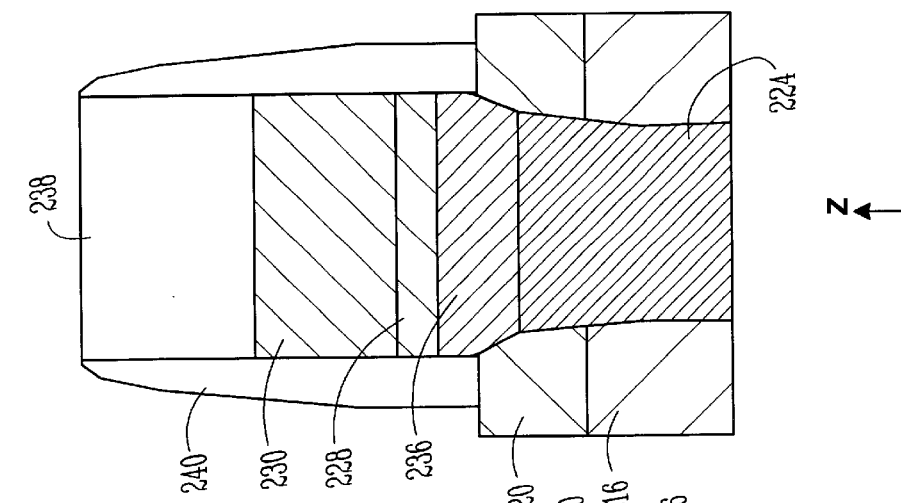
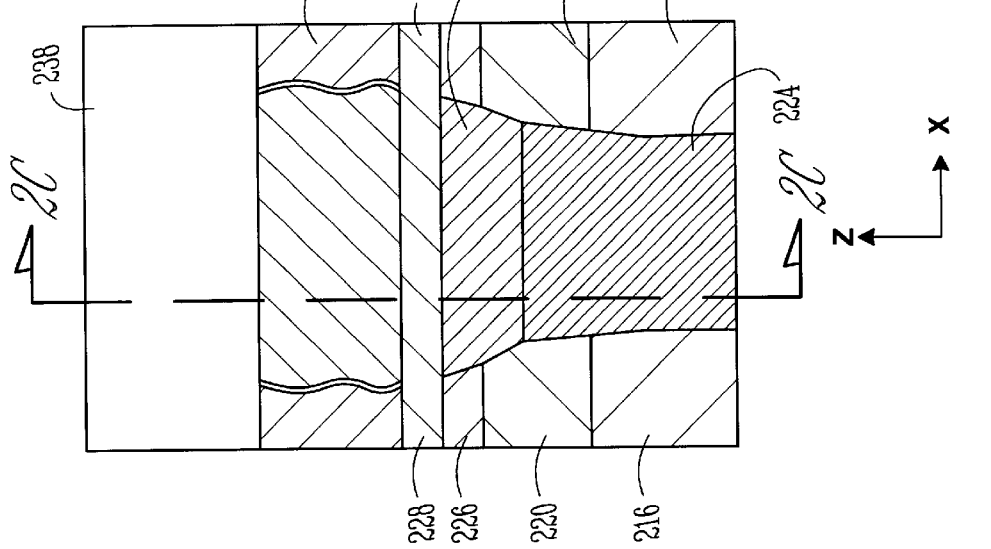
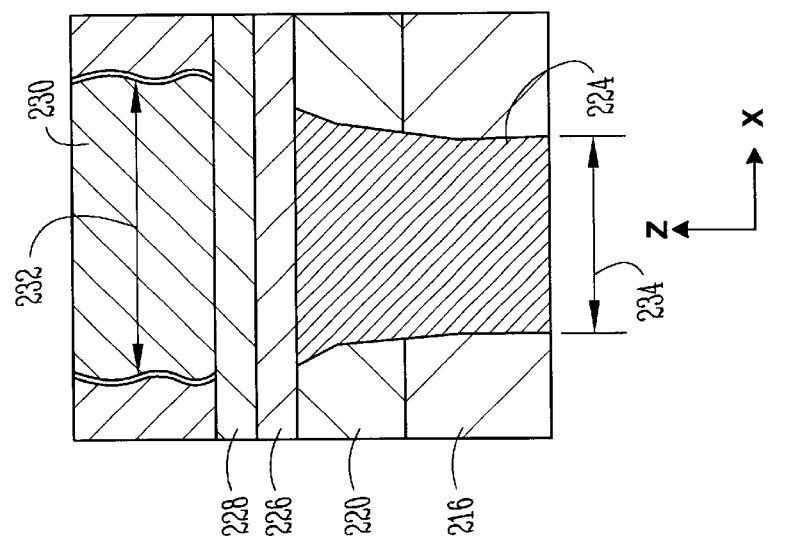

BURIED DIGIT LINE STACK AND PROCESS FOR MAKING SAME

FIELD OF THE INVENTION

The field of the invention relates to semiconductor processing. More particularly, one embodiment relates to a process of making an electrical coupling between semiconductive material and a metal. In particular, an embodiment relates to a process for making a tungsten buried digit line ("WBDL") stack.

BACKGROUND

Semiconductor processing is an intensive activity during which several processes are integrated to achieve a working device. Miniaturization is the process of crowding more semiconductive devices onto a smaller substrate area in order to achieve better device speed, lower energy usage, and better device portability, among others. New processing methods must often be developed to enable miniaturization to be realized. The advent of the buried digit line ("BDL") allowed for a lower overall profile of a dynamic random access memory ("DRAM") device. However, the average grain size ("gs") of a metallization continues to decrease in a manner that causes grains to form that follow the grain boundaries of a substrate. Accordingly, a higher than desirable resistivity persists despite miniaturization.

One challenge is to prevent metal agglomeration during back-end-of-line ("BEOL") processing. The challenge to achieve digit line communication in a memory device that has a low resistivity, is often accompanied by the challenge to achieve a temperature-resistant digit line that is protected from the encroachment of damaging elements during BEOL processing, burn-in testing, and field use. Thus, what is needed is a conductive structure that overcomes some of the challenges of the prior art.

SUMMARY

The above mentioned problems and challenges are overcome by embodiments of this invention. One embodiment is directed to a process of forming a tungsten buried digit line ("WBDL") stack on a substrate. The process includes forming a silicon-lean metal silicide first film over a polysilicon plug. Next, a metal silicide nitride second film is formed by reactively sputtering a silicon-rich metal silicide target with a nitrogen gas. The metal silicide nitride second film is covered with a tungsten third film. A salicidation process causes the first film to salicide with the polysilicon plug. In one embodiment, all the aforementioned deposition processes are carried out by physical vapor deposition ("PVD").

In another embodiment, a process of forming a WBDL stack is carried out on a substrate. The process includes forming a silicon-lean metal silicide first film over a polysilicon plug. Next, a titanium nitride second film is formed by sputtering a titanium nitride target above the first film. The titanium nitride second film is covered with a tungsten third film. A salicidation process causes the first film to salicide with the polysilicon plug.

Because the buried digit line structures of active devices are formed according to embodiments of the present invention, a lower resistivity and a higher thermal processing yield are achieved.

Another embodiment relates to a device that includes a BDL structure. The device is packaged and implemented in a host. In one embodiment, the host includes a memory module, In another embodiment, the host includes a computer system with a processor, a memory system, and at least one I/O device connected to the host.

BRIEF DESCRIPTION OF THE DRAWINGS

In order to illustrate the manner in which embodiments of the present invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying figures in which:

FIG. 2A is a section taken along the line 2—2 from the structure depicted in FIG. 1 after further processing according to an embodiment;

FIG. 2B is a cross section of the structure depicted in FIG. 2A after further processing;

FIG. 2C is a cross section of the structure depicted in FIG. 2B, taken orthogonal to the plane of FIG. 2B, along the line 2C–2C'.

DETAILED DESCRIPTION

Figure 1:
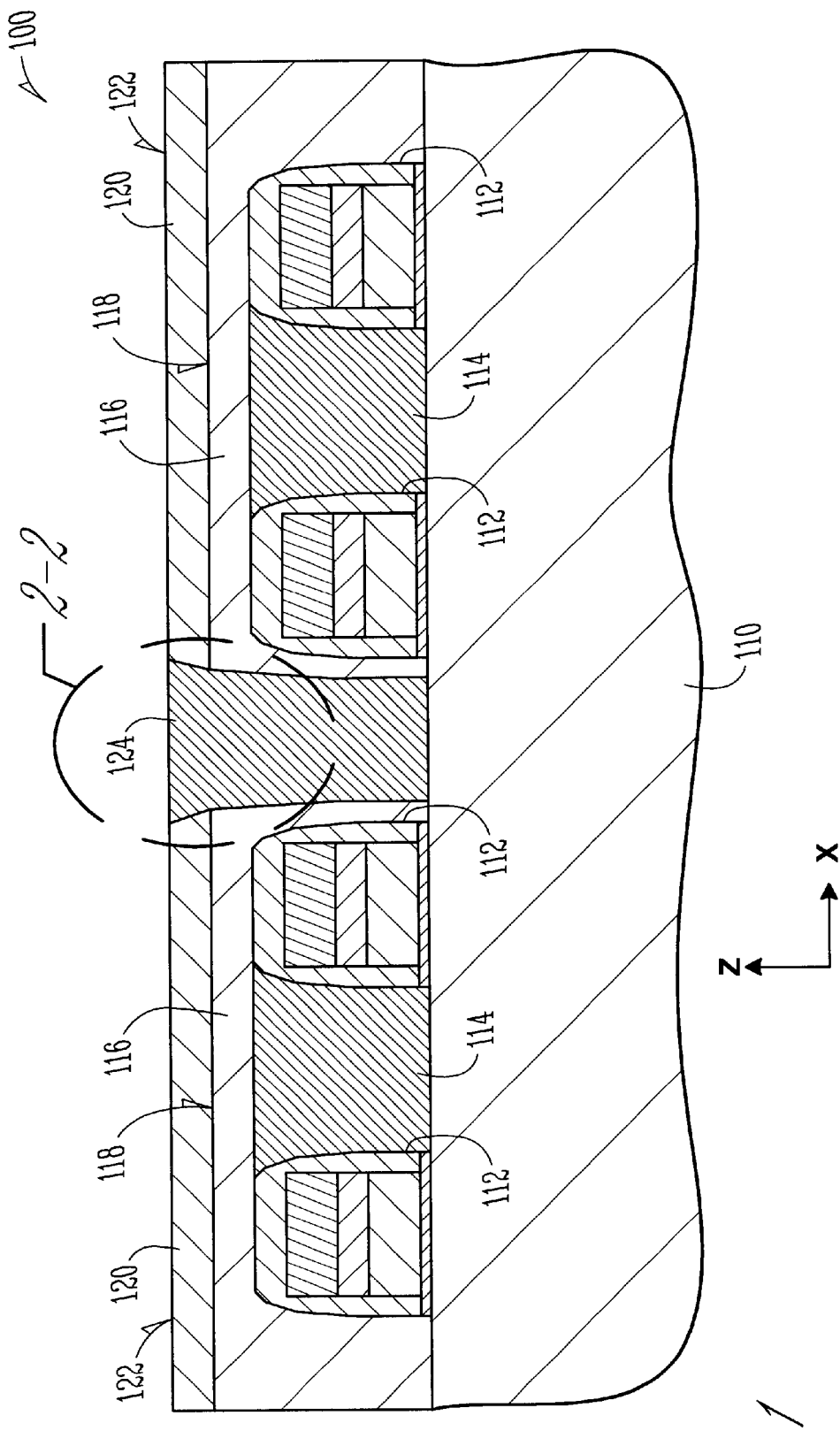
FIG. 1 is a cross section of a structure during processing according to an embodiment.

In the following detailed description, reference is made to the accompanying drawings which form a part hereof, and in which is shown, by way of illustration, specific ways which embodiments may be practiced. In the drawings, like numerals describe substantially similar components throughout the several views. These embodiments are described in sufficient detail to enable those skilled in the art to practice various embodiments. Other embodiments may be utilized and structural, logical, and electrical changes may be made without departing from the scope of the various embodiments. The terms wafer and substrate used in the following description include any structure having an exposed surface with which to form an integrated circuit (IC) structure embodiment.

The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

FIG. 1 is a cross section of a structure 100 during processing according to an embodiment. Although the structure 100 appears to be a precursor for a memory cell, embodiments are applicable to other semiconductive devices. A substrate 110 includes active areas (not pictured) and a plurality of gate stacks 112 on the substrate 110. The gate stacks 112 are spaced apart by conductive landing pads 114 that are precursors for communication to capacitive storage cells (not pictured). A first dielectric 116 is depicted as being deposited and etched back to a first upper surface 118, after which a second dielectric 120 is deposited and also etched back to a second upper surface 122. In one embodiment, the first dielectric 116 is borophosphosilicate glass (BPSG), and the second dielectric 120 is decomposed tetraethylortho silicate (TEOS). Other dielectric materials are used according to process flow needs. In one embodiment, the first dielectric 116 and the second dielectric 120 are a single structure that is formed by a deposition and an etchback such as a chemical-mechanical polishing ("CMP").

Between two gate stacks 112 a conductive plug 124 has been formed by etching to silicon of the substrate 110, and by etching back to the second upper surface 122. In one embodiment, the conductive plug 124 is made of polysilicon (hereinafter referred to as a polysilicon plug 124) that is filled into a contact corridor in the dielectric layer(s). By this process, the conductive landing pads 114 are isolated from the polysilicon plug 124. After further processing that is not set forth herein, it is noted that access to the conductive landing pads 114 is either in front of the plane of the figure or behind it. In other words, the cross section depicted in FIG. 1 is taken along an oblique line such that the conductive landing pads 114 include one in front of the polysilicon plug 124, and one behind the polysilicon plug 124 when viewed aligned along a rectilinear array (not pictured).

A first general embodiment is depicted in FIGS. 2A to 2C. FIG. 2A is a section taken along the line 2—2 from the structure 100 depicted in FIG. 1 after further processing. A polysilicon plug 224 is disposed in a first dielectric 216 and a second dielectric 220. A refractory metal silicide first film 226 is formed by physical vapor deposition (PVD) over the polysilicon plug 224 as well as over the first dielectric 216 and the second dielectric 220. In one embodiment the refractory metal first film 226 is formed from a metal silicide target. In one embodiment, the refractory metal is selected from titanium (Ti), zirconium (Zr), hafnium (Hf), or combinations thereof. In one embodiment, the refractory metal is selected from vanadium, (V), niobium (Nb), tantalum, (Ta), or combinations thereof. In one embodiment, the refractory metal is selected from chromium (Cr), molybdenum (Mo), tungsten (W), or combinations thereof. In one embodiment, the refractory metal is selected from cobalt (Co), rhodium (Rh), iridium (Ir), or combinations thereof. In one embodiment, the refractory metal is selected from nickel (Ni), palladium (Pd), platinum (Pt), or combinations thereof.

In one embodiment the refractory metal that is used, is generated from a refractory metal silicide target to form the refractory metal first film 226. According to this process embodiment, the refractory metal silicide first film 226 includes PVD forming a solid solution of refractory metal silicide according to the formula $MSi_x$, and the refractory metal is M and $0<x \leq 3$.

In another embodiment, forming the refractory metal silicide first film 226 is done by sputtering from a silicon-lean target refractory metal silicide target, such that the PVD process generates a refractory metal silicide first film 226 according to the formula of about $MSi_{0.6}$. In one embodiment, the refractory metal silicide first film 226 is according to the formula of about $TaSi_{0.6}$. In one embodiment, the refractory metal silicide first film 226 is according to the formula of about $MSi_{0.6}$, and M is TaTi and Ta varies from about 20% to about 99%. In one embodiment, the refractory metal silicide first film 226 is according to the formula of about $WSi_{0.6}$. In one embodiment, the refractory metal silicide first film 226 is according to the formula of about $MSi_{0.6}$, and M is WTi and W varies from about 20% to about 99%. In one embodiment, the refractory metal silicide first film 226 is according to the formula of about $MoSi_{0.6}$. In one embodiment, the refractory metal silicide first film 226 is according to the formula of about $MSi_{0.6}$, and M is MoTi and Mo varies from about 20% to about 99%. In one embodiment, the refractory metal silicide first film 226 is according to the formula of about $HfSi_{0.6}$. In one embodiment, the refractory metal silicide first film 226 is according to the formula of about $MSi_{0.6}$, and M is HfTi and Hf varies from about 20% to about 99%. Although specific combinations are explicitly set forth above as embodiments, other combinations include TaW, TaWTi, TaMo, TaMoTi, TaHf, TaHfTi, WMo, WMoTi, WHf, WHfTi, MoTi, MoHf, and MoHfTi,. By the two-component combinations, the first element varies from about 20% to about 99%. By the three-component combinations, the first element varies from about 20% to about 90%, the second element varies from about 10% to about 80%, and the third element varies from about 0% to about 70%.

An amorphous refractory metal silicide nitride second film 228 is formed after PVD formation of the refractory metal silicide first film 226 according to an embodiment. In one embodiment, the amorphous refractory metal silicide nitride second film 228 is formed by PVD. In one embodiment, the PVD process is in the same tool that was used to form the refractory metal suicide first film 226. In another embodiment, a CVD process is used to form the amorphous refractory metal suicide nitride second film 228. In yet another embodiment, an atomic layer deposition ("ALD") process is used to form the amorphous refractory metal silicide nitride second film 228. The refractory metal silicide nitride second film 228 is a solid solution of metal and silicon and nitrogen, or a composite of metal silicides and silicon nitrides. The amount of nitrogen ranges from a doping quantity as is understood in the art to a stoichiometric ratio. The ratio of nitrogen in the amorphous refractory metal silicide nitride second film 228 can be controlled by the amount of nitrogen that is used in the reactive sputtering process.

The sputtering target that is used to make the amorphous refractory metal silicide nitride second film 228, has a formula of $MSi_x$, and the refractory metal is M, and $0<x\leq3$. In one embodiment the target is silicon rich such that the target includes a formula of about $MSi_{2.2}$. Sputtering is carried out reactively in the presence of nitrogen such that the refractory metal silicide target with a formula of $MSi_x$ results in a refractory metal silicide nitride second film 228 with a formula of about $MN_ySi_x$, and the refractory metal is M, and $0<x\leq3$, and and $0<y\leq1$. Although no specific theory is proposed, it is recognized that the presence of nitrogen may act to cause an amorphous second film 228 to form under known sputtering conditions.

The refractory metal that is used to form the refractory metal silicide nitride second film 228, is a refractory metal such as set forth above that is used to form the various embodiments of the refractory metal first film 226. In one embodiment, the refractory metal suicide nitride second film 228 has the formula of about $TaSi_{2-x}N_x$, and N has a range from about 0.001 to about 1. In another embodiment, the refractory metal silicide nitride second film 228 has the formula of about $WSi_{2-x}N_x$, and N has a range from about 0.001 to about 1. In another embodiment, the refractory metal silicide nitride second film 228 has the formula of about $MoSi_{2-x}N_x$, and N has a range from about 0.001 to about 1. In another embodiment, the refractory metal silicide nitride second film 228 has the formula of about $HfSi_{2-x}N_x$, and N has a range from about 0.001 to about 1.

A refractory metal third film 230 is formed after the formation of the refractory metal silicide nitride second film 228. In one embodiment, the refractory metal third film 230 is formed by PVD such as by sputtering a refractory metal target.

As the refractory metal third film 230 has a dimension in one embodiment that is thicker than the first and second films 226 and 228 respectively, it acts as a major structure in a BDL for a memory device. As set forth above for refractory metal precursors for the first and second films 226 and 228, respectively, various refractory metals are useful for this embodiment. In one embodiment, the refractory metal third film 230 is sputtered from a W target. In another embodiment, the refractory metal third film 230 is sputtered from a Ta target. In another embodiment, the refractory metal third film 230 is sputtered from a Ti target. Other target embodiments used in the process include TaW, TaWTi, TaMo, TaMoTi, TaHf, TaHfTi, WTi, WMo, WMoTi, WHf, WHfTi, Mo, MoTi, MoHf, MoHfTi, and HfTi. By the two-component combinations, the first element varies from about 20% to about 99%. By the three-component combinations, the first element varies from about 20% to about 90%, the second element varies from about 10% to about 80%, and the third element varies from about 0% to about 70%.

The average grain size 232 of the refractory metal third film 230 is in a range from about one-tenth the characteristic dimension 234 of the polysilicon plug 224 to greater than the characteristic dimension 234. The average grain size 232 depicted in FIG. 2A, is illustrated also in an arbitrary size, shape, and location (centered over the polysilicon plug 224) for illustrative convenience. Other average grain sizes, shapes, and locations are achievable according to various processing conditions set forth herein, and as known in the art.

The characteristic dimension 234 of the polysilicon plug 224 is tied to the process photolithography. In one embodiment, the characteristic dimension 234 is the critical dimension of a set of photolithographic design rules. By way of further reference, according to design rules, a characteristic dimension may be part of the metric of the structure depicted in FIG. 2A. In this embodiment, the minimum feature may be the diameter of the contact corridor that accommodates the polysilicon plug 234. For example, photolithography process flows may have a minimum feature geometry that is one of 0.25 micrometers (microns), 0.18 microns, 0.15 microns, 0.13 microns, and 0.11 microns. It is understood that the various metrics such as a 0.15-micron photolithography geometry may have different dimensions in a first business entity compared to a second business entity. Accordingly, such metrics, although quantitatively called out, may differ between two given business entities. Other minimum features that may be accomplished in the future are applicable to the present invention.

In another embodiment, the formation of the first film 226, the second film 228, and the third film 230 are all carried out in a single PVD tool. One achievement of this embodiment is a high productivity throughput as various targets are placed in or near the tool, and are moved into multiple chambers in the same tool when appropriate. By this achievement, a single tool is prepped once for a triple-PVD process.

FIG. 2B is a cross section of the structure depicted in FIG. 2A after further processing. A salicide (self-aligned silicide) structure 236 is formed from a portion of the polysilicon plug 224 and the refractory metal silicide first film 226. Salicidation is carried out at a temperature that is below the melting point of the refractory metal silicide nitride second film 228, and also below the temperature at which nitrogen is denuded from the refractory metal suicide nitride second film 228.

In one embodiment, a rapid thermal process ("RTP") is carried out. In one embodiment, a first heating is done at a temperature range from about 750° C. to about 850° C. In another embodiment, a first heating is done at a temperature range from about 750° C. to about 850° C., followed by a second heating at a temperature range from about 920° C. to about 980° C. In any event, the first heating process temperature is high enough to cause salicidation between the polysilicon plug 224 and the refractory metal silicide first film 226, but low enough to prevent significant nitrogen migration into the salicide structure 236. During further processing, often referred to as BEOL processing that spends the thermal budget, the amorphous refractory metal silicide nitride second film 228 is substantially denuded of nitrogen (not pictured) by migration of nitrogen into the salicide structure 236. By "substantially denuded" it is meant that about 15% of the nitrogen, or more, migrates out of the amorphous refractory metal silicide nitride second film 228. In one embodiment, the melting point of the refractory metal silicide nitride second film 228 is above about 900° C.

FIG. 2C is a cross section of the structure depicted in FIG. 2B, taken orthogonal to the plane of FIG. 2B, along the line 2C–2C'. It is noted that the X-dimension is not depicted in FIG. 2C, as the view is orthogonal to the X-dimension. After further processing, a dielectric cap layer 238 (hereinafter referred to by way of non-limiting example as "nitride cap layer 238) is formed. In one embodiment, the nitride cap layer 238 is formed before growth of the salicide structure 236, as shown in FIG. 2B. In another embodiment, the CVD nitride cap layer 238 is formed during growth of the salicide structure 236. In yet another embodiment, the nitride cap layer 238 is formed after growth of the salicide structure 236.

As depicted in FIG. 2C, a digit line structure is completed with the formation of a digit line spacer 240. In one embodiment, in place of the digit line spacer 240, a blanket dielectric deposition (not pictured) covers an array of buried digit lines ("BDLs"). The BDL includes the salicide structure 236 that forms a salicide first film. The BDL also includes, the refractory metal silicide nitride second film 228 (although it may be substantially denuded of nitrogen as set forth herein), and the refractory metal third film 230, among other structures.

The BDL structure is fabricated with varying film thicknesses. Examples 1–4 are set forth in Table 1 to illustrate various film-thickness embodiments.

TABLE 1

WBDL Structures, all thicknesses in Å

| | Example 1 | Example 2 | Example 3 | Example 4 |
|---|---|---|---|---|
| Cap layer | 200 | 500 | 1,000 | 1,500 |
| 3rd film, W. | 50 | 200 | 350 | 500 |
| 2nd film*, $TaSi_{2-x}N_x$ | 20 | 50 | 100 | 200 |
| 1st film**, $TaSi_2$ | 30 | 70 | 130 | 300 |

*2nd film includes residual amounts of N that did not migrate into the 1st film.
**Salicided. Includes some N that migrated from the 2nd film.

Resistivity in the WBDL third film 230 is measured in a range from about 2.5 Ω/sq to about 25 Ω/sq. The average grain size for the WBDL third film 230 depicted in Table 1, is in a range from about 20 nm to about 500 nm. In another embodiment, the average grain size is in a range from about 30 nm to about 150 nm. By various processes, it will be apparent that the refractory metal third film 230 can include a resistivity in a range from about 0.1 Ω/sq to about 1,000 Ω/sq.

Figures 3A, 3B, 3C:
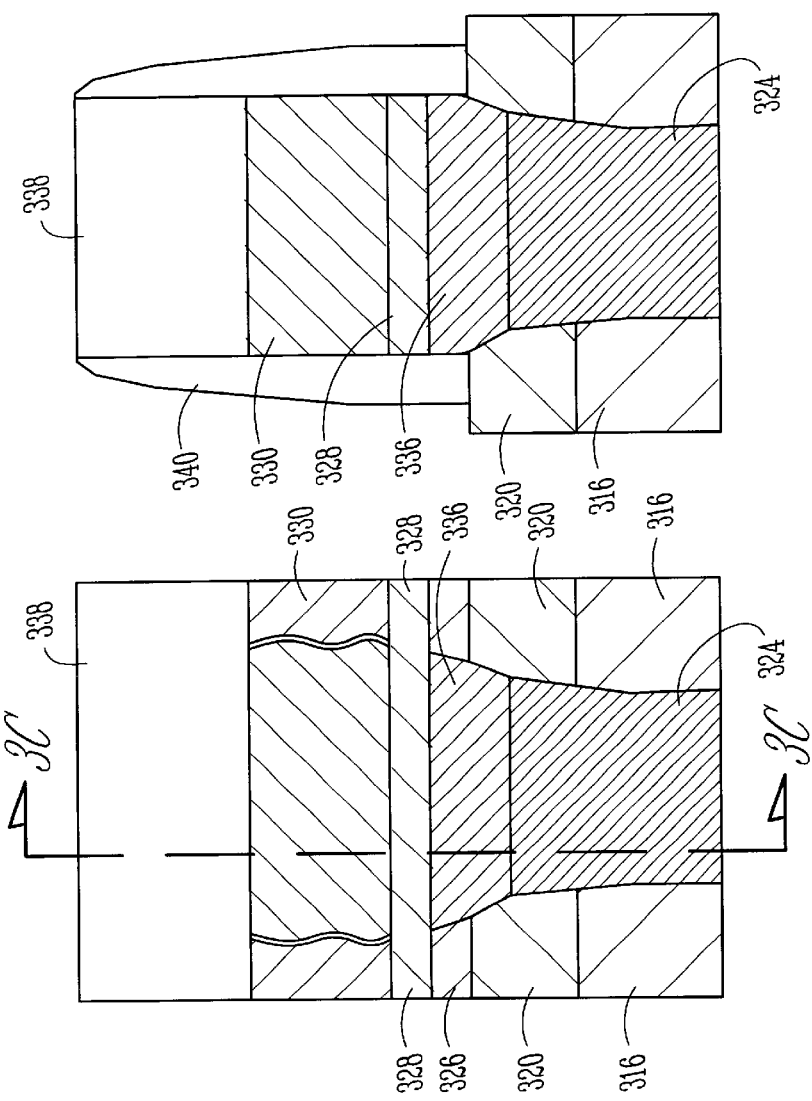
FIG. 3A is a cross section of another embodiment that bears similarity to the structure depicted in FIG. 2A.
FIG. 3B is a cross section of the structure depicted in FIG. 3A after further processing.
FIG. 3C is a cross section of the structure depicted in FIG. 3B, taken orthogonal to the plane of FIG. 3B, along the line 3C–3C'.

A second general embodiment is depicted in FIGS. 3A to 3C. FIG. 3A is another embodiment that bears some similarity to the structure depicted in FIG. 2A, and it may be viewed as a structure taken from FIG. 1, also along the line 2—2. A polysilicon plug 324 is disposed in a first dielectric 316 and a second dielectric 320. A refractory metal silicide first film 326 is formed by physical vapor deposition (PVD) over the polysilicon plug 324 as well as over the second insulator 320. In one embodiment, the refractory metal is selected from Ti, Zr, Hf, or combinations thereof. In one embodiment, the refractory metal is selected from V, Nb, Ta, or combinations thereof. In one embodiment, the refractory metal is selected from Cr, Mo, W, or combinations thereof. In one embodiment, the refractory metal is selected from Co, Rh, Ir, or combinations thereof. In one embodiment, the refractory metal is selected from Ni, Pd, Pt, or combinations thereof.

In one embodiment the refractory metal that is used, is generated from a refractory metal silicide target to form the refractory metal first film 326. According to this process embodiment, the refractory metal silicide first film 326 includes forming a solid solution of refractory metal silicide according to the formula $MSi_x$, and the refractory metal is M and $0 < x \leq 3$.

In another embodiment, forming the refractory metal silicide first film 326 is done by sputtering from a silicon-lean refractory metal silicide target such that the PVD process generates a refractory metal silicide first film 326 according to the formula of about $MSi_{0.6}$. In one embodiment, the refractory metal silicide first film 326 is according to the formula of about $TaSi_{0.6}$. In one embodiment, the refractory metal silicide first film 326 is according to the formula of about $MSi_{0.6}$, and M is TaTi and Ta varies from about 20% to about 99%. In one embodiment, the refractory metal silicide first film 326 is according to the formula of about $WSi_{0.6}$. In one embodiment, the refractory metal silicide first film 326 is according to the formula of about $MSi_{0.6}$, and M is WTi and W varies from about 20% to about 99%. In one embodiment, the refractory metal silicide first film 326 is according to the formula of about $MoSi_{0.6}$. In one embodiment, the refractory metal silicide first film 326 is according to the formula of about $MSi_{0.6}$, and M is MoTi and Mo varies from about 20% to about 99%. In one embodiment, the refractory metal silicide first film 328 is according to the formula of about $HfSi_{0.6}$. In one embodiment, the refractory metal silicide first film 328 is according to the formula of about $MSi_{0.6}$, and M is HfTi and Hf varies from about 20% to about 99%. Although specific combinations are explicitly set forth above as embodiments, other combinations include TaW, TaWTi, TaMo, TaMoTi, TaHf, TaHfTi, WTi, WMo, WMoTi, WHf, WHfTi, MoHf, and MoHfTi. By the two-component combinations, the first element varies from about 20% to about 99%. By the three-component combinations, the first element varies from about 20% to about 90%, the second element varies from about 10% to about 80%, and the third element varies from about 0% to about 70%.

A titanium nitride second film 328 is formed after PVD formation of the refractory metal silicide first film 326 according to an embodiment. The titanium nitride second film 328 is a compound of titanium and nitrogen. The amount of nitrogen ranges from a doping quantity to stoichiometric to excess over stoichiometric. In one embodiment, the amorphous titanium nitride second film 328 is formed by PVD in the same tool that was used to form the refractory metal silicide first film 326. In another embodiment, a CVD process is used to form the titanium nitride second film 328. In yet another embodiment, an ALD process is used to form the titanium nitride second film 328.

Although "titanium nitride" is referred to, it is within the meaning of the specification and the claims to include other refractory metals in addition to, or in place of titanium. The refractory metal that is used to form the refractory metal nitride second film 328, is a refractory metal such as set forth above for the various embodiments of the refractory metal nitride first film 326. One characteristic of the titanium nitride second film 328 is that it retains its nitrogen during processing temperatures that form a salicide structure as set forth below. Another characteristic of the titanium nitride second film 328 is that it may release some of its nitrogen during and after BEOL thermal processing.

A refractory metal third film 330 is formed after the formation of the titanium nitride second film 328. In one embodiment, the refractory metal third film 330 is formed by PVD such as by sputtering a refractory metal target. In another embodiment, the refractory metal third film 330 is formed by CVD. In yet another embodiment, an ALD process is used to form the refractory metal third film 330. In one embodiment, the refractory metal third film 330 is a CVD tungsten film.

As the refractory metal third film 330 has a dimension in one embodiment that is thicker than the first and second films 326 and 328 respectively, it acts as a major structure in a BDL for a memory device. As set forth above for refractory metal precursors for the first and second films 326 and 328, respectively, various refractory metals are useful for this embodiment.

In one embodiment, the refractory metal third film 330 is sputtered from a W target. In another embodiment, the refractory metal third film 330 is sputtered from a Ta target. In another embodiment, the refractory metal third film 330 is sputtered from a Ti target. Other target embodiments used in the process include TaW, TaWTi, TaMo, TaMoTi, TaHf, TaHfTi, WTi, WMo, WMoTi, WHf, WHfTi, Mo, MoTi, MoHf, MoHfTi, and HfTi. By the two-component combinations, the first element varies from about 20% to about 99%. By the three-component combinations, the first element varies from about 20% to about 90%, the second element varies from about 10% to about 80%, and the third element varies from about 0% to about 70%.

The average grain size 332 of the refractory metal third film 330 is in a range from about one-tenth the characteristic dimension 334 of the polysilicon plug 324 to greater than the characteristic dimension 334. The average grain size 332 depicted in FIG. 3A, is illustrated also in an arbitrary size, shape, and location (centered over the polysilicon plug 324) for illustrative convenience according to an embodiment. Other average grain sizes, shapes, and locations are achievable according to various processing conditions set forth herein, and as known in the art.

The characteristic dimension 334 is tied to the process photolithography. For example and not by way of limitation, the characteristic dimension may have a minimum feature geometry that is one of 0.25 microns, 0.18 microns, 0.15 microns, 0.13 microns, and 0.11 microns.

FIG. 3B is a cross section of the structure depicted in FIG. 3A after further processing. A salicide structure 336 is grown from a portion of the polysilicon plug 324 and the refractory metal silicide first film 326. Salicidation is carried out at a temperature below the melting point of the titanium nitride second film 328, and also below the temperature at which nitrogen is denuded from the titanium nitride second film 328. In one embodiment, a first heating is done at a temperature range from about 750° C. to about 850° C. In another embodiment, a first heating is done at a temperature range from about 750° C. to about 850° C., followed by a second heating at a temperature range from about 920° C. to about 980° C. In any event, the first heating temperature is high enough to cause salicidation between the polysilicon plug 324 and the refractory metal silicide first film 326, but low enough to prevent significant nitrogen migration into the salicide structure 336. In one embodiment, the melting point of the titanium nitride second film 328 is above about 1,100° C.

FIG. 3C is a cross section of the structure depicted in FIG. 3B, taken orthogonal to the plane of FIG. 3B, along the line 3C–3C'. After further processing, a nitride cap layer 338 is formed. In one embodiment, the nitride cap layer 338 is formed before growth of the salicide structure 336. In another embodiment, the nitride cap layer 338 is grown during the growth of the salicide structure 336. In yet another embodiment, the nitride cap layer 338 is grown after formation of the salicide structure 336.

As depicted in FIG. 3C, a BDL structure is completed with the formation of a digit line spacer 340. In one embodiment, the digit line spacer 340 is replaced with a blanket dielectric deposition (not pictured) that covers an array of BDLs. The BDL includes the salicide structure 336 that forms a salicide first film. The BDL also includes, the titanium nitride second film 328 (although it may be substantially denuded of nitrogen as set forth herein), and the refractory metal third film 330, among other structures.

The BDL structure is fabricated with varying film thicknesses. Examples 5–8 are set forth in Table 2 to illustrate various film-thickness embodiments.

TABLE 2

| WBDL Structures, all thicknesses in Å | | | | |
|---|---|---|---|---|
| | Example 5 | Example 6 | Example 7 | Example 8 |
| Cap layer | 200 | 500 | 1,000 | 1,500 |
| 3rd film, W. | 50 | 200 | 350 | 500 |
| 2nd film, TiN | 20 | 50 | 100 | 200 |
| 1st film*, TaSi$_2$ | 30 | 70 | 130 | 300 |

*Salicided. Includes some N that migrated from the 2nd film.

Resistivity in the WBDL third film 330 is measured in a range from about 2 Ω/sq to about 20 Ω/sq. The average grain size for the WBDL third film 330 depicted in Table 2, is in a range from about 20 nm to about 500 nm. In another embodiment, the average grain size is in a range from about 30 nm to about 250 nm. By various processes, it will be apparent that the refractory metal third film 330 can include a resistivity in a range from about 0.1 Ω/sq to about 1,000 Ω/sq.

Figure 4:
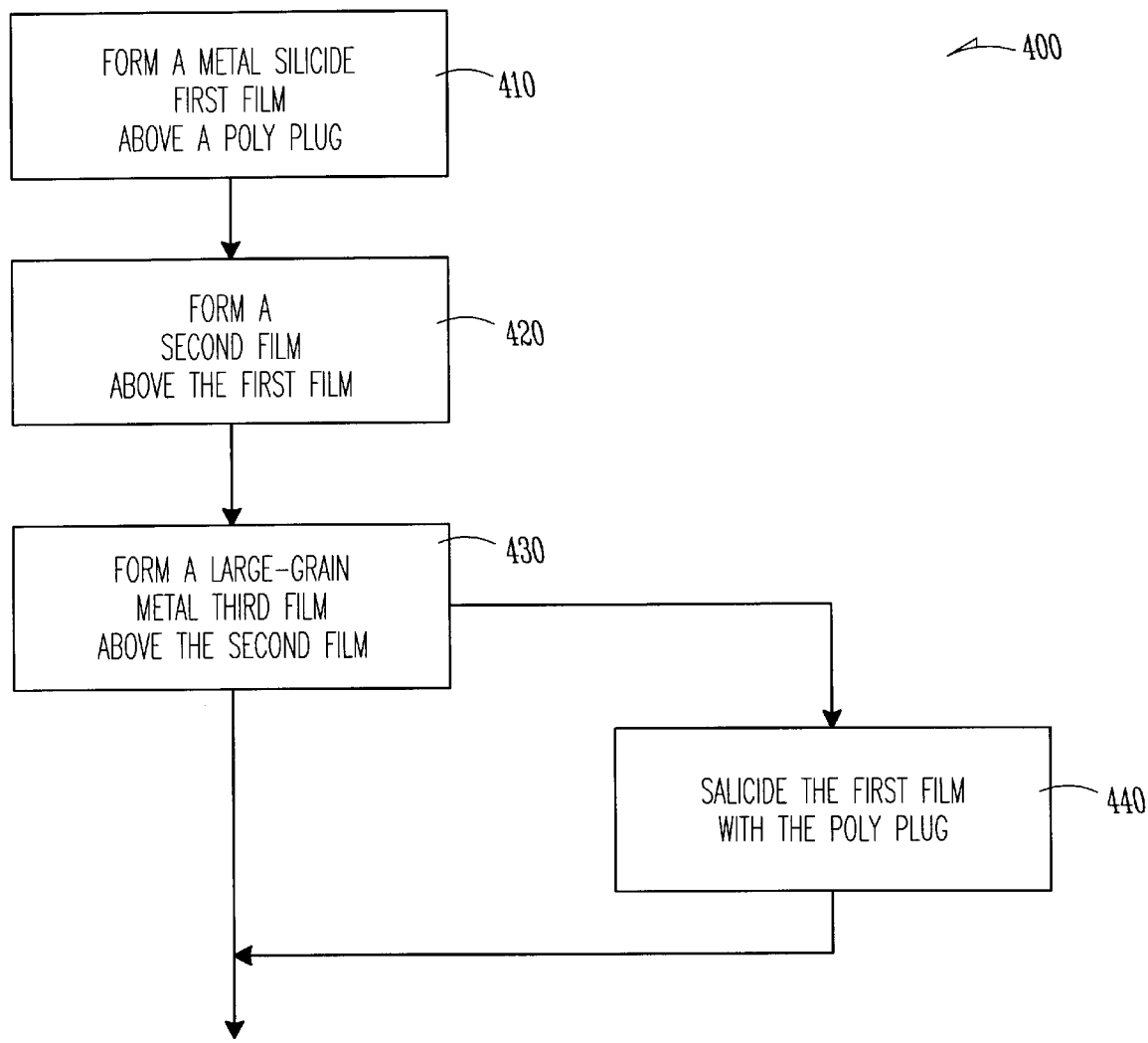
FIG. 4 is a process flow diagram according to an embodiment.

FIG. 4 is a process flow diagram 400 according to an embodiment. The embodiments referred to in FIGS. 2A–2C and FIGS. 3A–3C can be referred to according to the process flow. At 410, a metal silicide first film is formed above an active area of a substrate. In one embodiment, the active area is coupled to the first film through a polysilicon plug or other conductive body.

At 420, a refractory metal compound barrier second film is formed above the first film. The refractory metal compound barrier second film is stable with respect to its retention of nitrogen during the growth of the salicide structure. At 430, a large-grained metal third film is formed above the refractory metal compound second film. The large grain size is quantified by comparison to a characteristic dimension in the structure. The process is complete at 430 in one embodiment.

At 440, the process is alternatively extended by saliciding the first film and the polysilicon plug. According to this embodiment, the process flow is complete at 440.

FIGS. 5 through 10 illustrate other embodiments. The processes and structures that are achieved in the various embodiments are inventively applicable to a variety of devices and apparatuses. Specific systems can be made by process embodiments, or that include an embodiment or embodiments of the structure as disclosed herein. For example, a chip package can contain BDL structure according to an embodiment. In another example, the BDL structure is used for electrical coupling for incidental, non-memory applications such as a line for a sense amplifier, or a trace between active devices on a substrate. In one embodiment, an array of BDLs is included such as a line of sense amplifiers that use the BDLs. In another embodiment, the BDL is part of a 2-dimensional array of storage devices such as a DRAM array. In another embodiment, the BDL structure is part of an electrical device that includes the semiconductor substrate in a chip package and the chip package is part of a memory module or part of a chipset. In another embodiment, the memory module is part of a DRAM module that is inserted into a host such as a motherboard or a digital computer. In another embodiment, specific systems can be made that include the BDL structure. For example, a chip package can contain a substrate such as one set forth in this disclosure. In another embodiment, the BDL structure is part of an electrical device that includes the semiconductor substrate in a chip package and the chip package is part of a memory module or part of a chipset. In another embodiment, the memory module is part of a dynamic random access memory module that is inserted into a host such as a motherboard or a digital computer. In another embodiment, the BDL structure is part of an electronic system. In another embodiment, the BDL structure is fabricated with a floating gate. In another embodiment, the BDL structure is fabricated with a floating gate that is part of a flash memory device that in turn is part of a chipset such as a basic input-output system (BIOS) for an electrical device.

Figure 5:
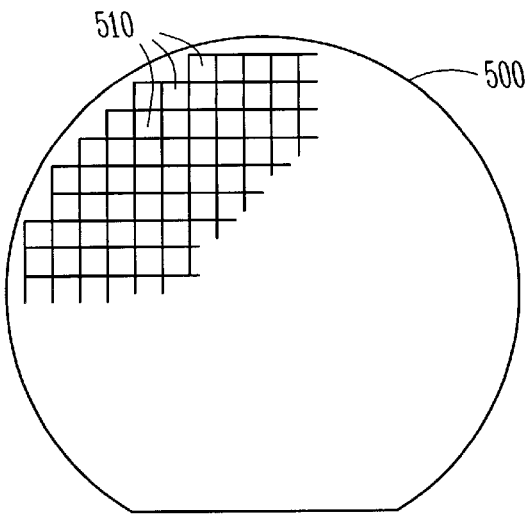
FIG. 5 is a top view of a wafer or substrate containing semiconductor dies in accordance with an embodiment.

FIG. 5 is a top view of a wafer 500 or substrate containing semiconductor dies in accordance with an embodiment. With reference to FIG. 5, a semiconductor die 510 can be produced from the silicon wafer 500 that contains the at least one of the BDL structures such as are depicted in FIGS. 2A–2C and FIGS. 3A–3C. A die 510 is an individual pattern, typically rectangular, on a substrate such as substrate 110 (FIG. 1) that contains circuitry to perform a specific function. A semiconductor wafer 500 will typically contain a repeated pattern of such dies 510 containing the same functionality. The die 510 can further contain additional circuitry to extend to such complex devices as a monolithic processor with multiple functionality. The die 510 is typically packaged in a protective casing (not shown) with leads extending therefrom (not shown) providing access to the circuitry of the die 510 for unilateral or bilateral communication and control. In one embodiment, the die 510 is incased in a host such as a chip package (not shown) such as a chip-scale package (CSP).

Figure 6:
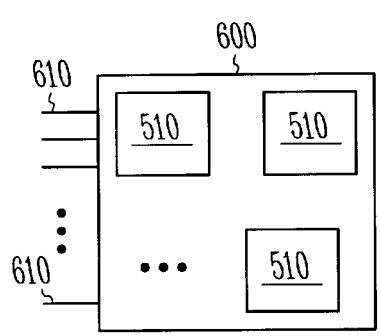
FIG. 6 is a block diagram of a circuit module in accordance with an embodiment.

FIG. 6 is a block diagram of a circuit module 600 in accordance with an embodiment. As shown in FIG. 6, two or more dies 510 at least one of which contains at least one BDL structure such as are depicted in FIGS. 2A–2C and FIGS. 3A–3C in accordance with various embodiments can be combined, with or without protective casing, into a host such as a circuit module 600 to enhance or extend the functionality of an individual die 510. Circuit module 600 can be a combination of dies 510 representing a variety of functions, or a combination of dies 510 containing the same functionality. Some examples of a circuit module 600 include memory modules, device drivers, power modules, communication modems, processor modules and application-specific modules and can include multi-layer, multi-chip modules. Circuit module 600 can be a subcomponent of a variety of electronic systems, such as a clock, a television, a cell phone, a personal,computer, an automobile, an industrial control system, an aircraft, a hand-held, and others. Circuit module 600 will have a variety of leads 610 extending therefrom providing unilateral or bilateral communication and control. In another embodiment, circuit module 600 includes the structure depicted in FIG. 1 as a two-cell precursor that will be fabricated into a storage device.

Figure 7:
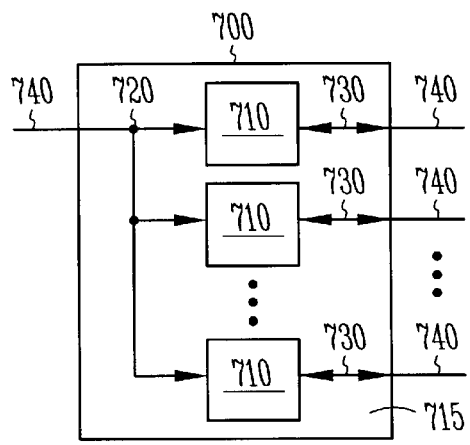
FIG. 7 is a block diagram of a memory module in accordance with an embodiment.

FIG. 7 is a block diagram of a memory module 700 in accordance with an embodiment. FIG. 7 shows one embodiment of a circuit module as a memory module 700 containing a BDL structure embodiment such as are depicted in FIGS. 2A–2C and FIGS. 3A–3C, or the two-cell storage device precursor (after further processing that is known in the art, but not illustrated) as is depicted in FIG. 1. Memory module 700 is a host that generally depicts a Single In-line Memory Module (SIMM) or Dual In-line Memory Module (DIMM). A SIMM or DIMM can generally be a printed circuit board ("PCB") or other support containing a series of memory devices. While a SIMM will have a single in-line set of contacts or leads, a DIMM will have a set of leads on each side of the support with each set representing separate I/O signals. Memory module 700 contains multiple memory devices 710 contained on a support 715, the number depending upon the desired bus width and the desire for parity. Memory module 700 can contain memory devices 710 on both sides of support 715. Memory module 700 accepts a command signal from an external controller (not shown) on a command link 720 and provides for data input and data output on data links 730. The command link 720 and data links 730 are connected to leads 740 extending from the support 715. Leads 740 are shown for conceptual purposes and are not limited to the positions shown in FIG. 7.

Figure 8:
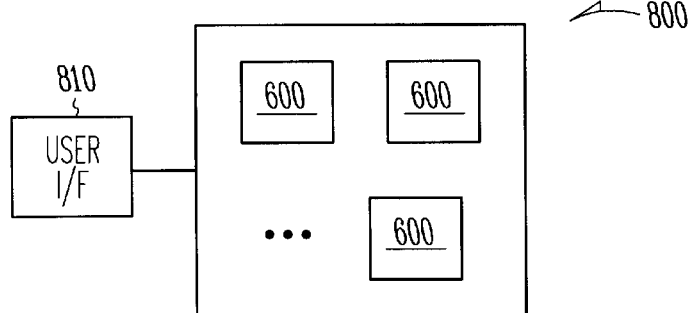
FIG. 8 is a block diagram of an electronic system in accordance with another embodiment the present invention.

FIG. 8 is a block diagram of an electronic system 800 in accordance with another embodiment the present invention. FIG. 8 shows another host type such as an electronic system 800 containing one or more circuit modules 600 as described above containing at least one of the BDL structures. Electronic system 800 generally contains a user interface 810. User interface 810 provides a user of the electronic system 800 with some form of control or observation of the results of the electronic system 800. Some examples of user interface 810 include the keyboard, pointing device, monitor and printer of a personal computer; the tuning dial, display and speakers of a radio; the ignition switch of gas pedal of an automobile; and the card reader, keypad, display and currency dispenser of an automated teller machine. User interface 810 can further describe access ports provided to electronic system 800. Access ports are used to connect an electronic system to the more tangible user interface components previously exemplified. One or more of the circuit modules 600 can be a processor providing some form of manipulation, control or direction of inputs from or outputs to user interface 810, or of other information either preprogrammed into, or otherwise provided to, electronic system 800. As will be apparent from the lists of examples previously given, electronic system 800 will often contain certain mechanical components (not shown) in addition to the circuit modules 600 and user interface 810. It will be appreciated that the one or more circuit modules 600 in electronic system 800 can be replaced by a single integrated circuit. Furthermore, electronic system 800 can be a subcomponent of a larger electronic system.

Figure 9:
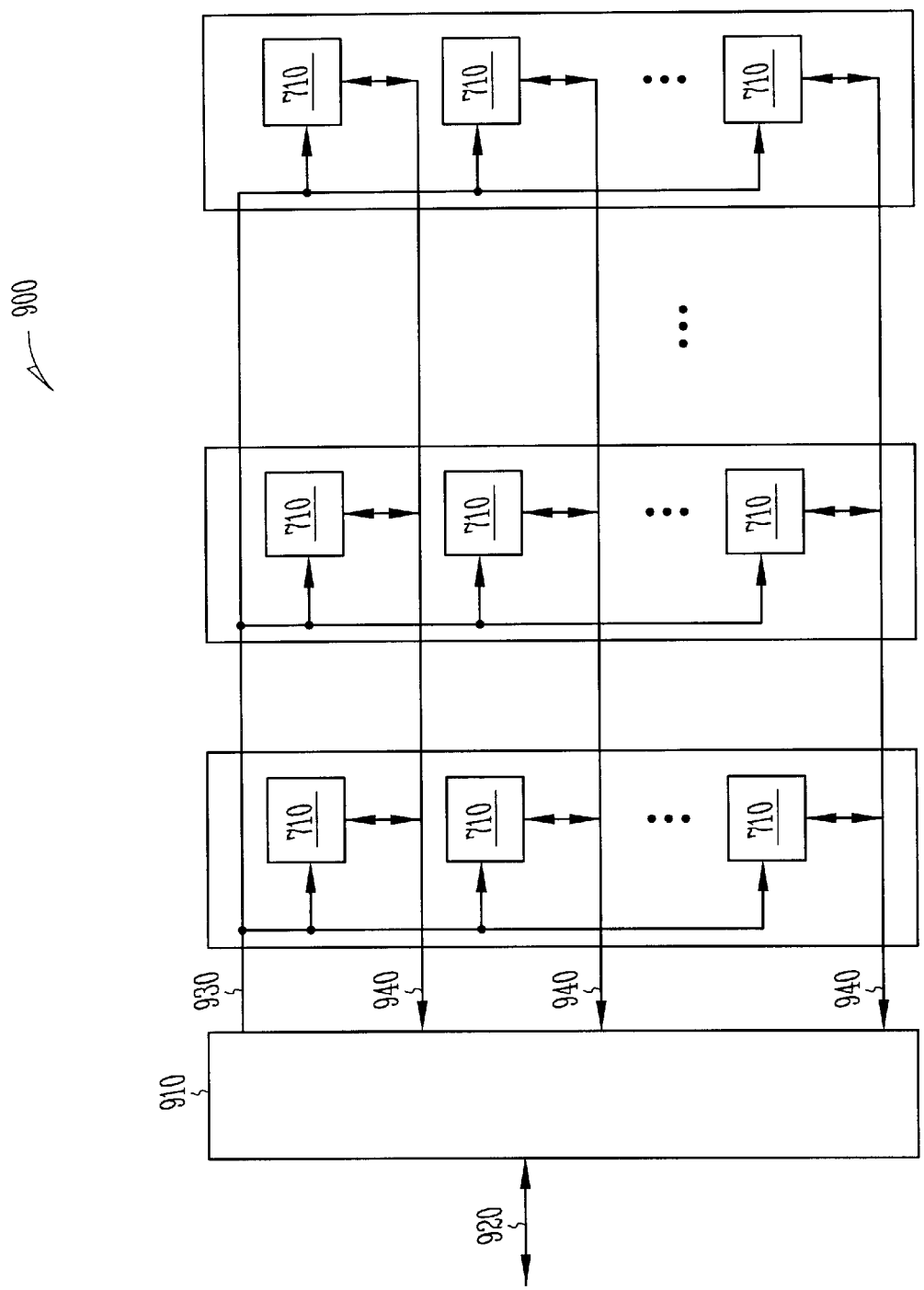
FIG. 9 is a block diagram of a memory system in accordance with an embodiment.

FIG. 9 is a block diagram of a memory system 900 in accordance with an embodiment. FIG. 9 shows one embodiment of an electrical device at a system level. Memory system 900 acts as a higher-level host that contains one or more memory devices 710 as described above including at least one of the buried digit line structures as set forth herein in accordance with various embodiments, and a memory controller 910 that can also include circuitry that is connected with a buried digit line structure as set forth herein. Memory controller 910 provides and controls a bidirectional interface between memory system 900 and an external system bus 920. Memory system 900 accepts a command signal from the external system bus 920 and relays it to the one or more memory devices 710 on a command link 930. Memory system 900 provides for data input and data output between the one or more memory devices 710 and external system bus 920 on data links 940.

Figure 10:
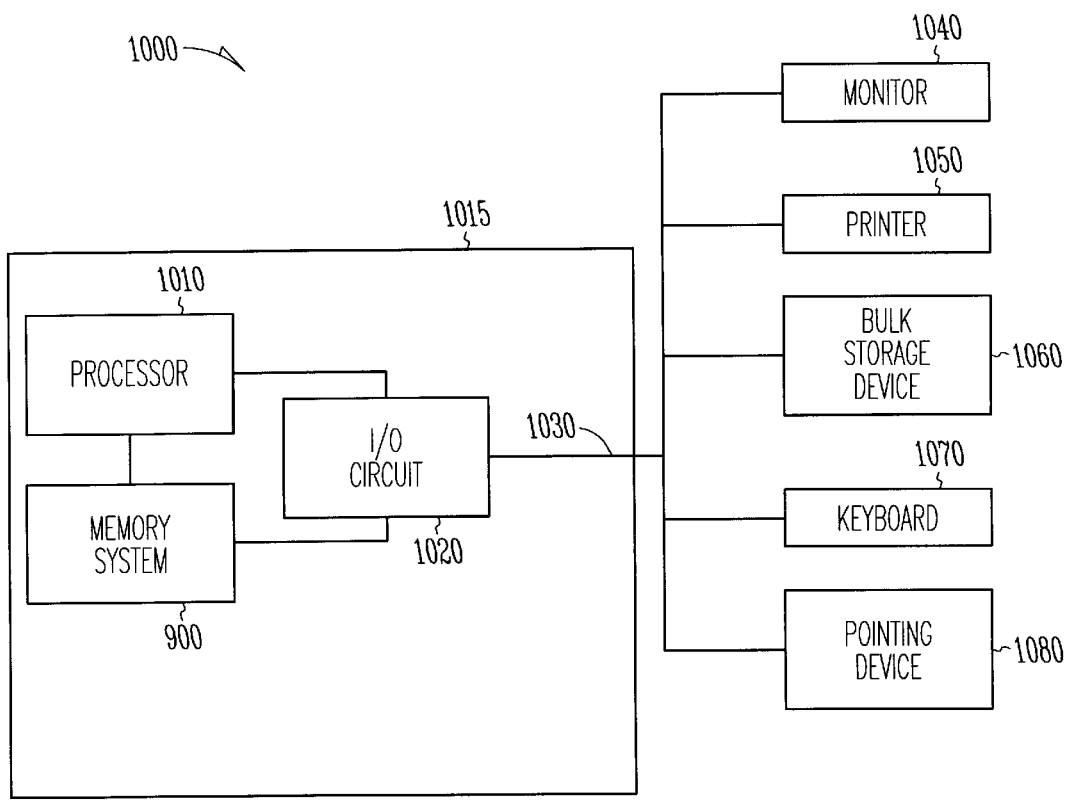
FIG. 10 is a block diagram of a computer system in accordance with an embodiment.

FIG. 10 is a block diagram of a computer system 1000 in accordance with an embodiment. FIG. 10 shows a further embodiment of an electronic system as a computer system 1000. Computer system 1000 contains a processor 1010 and a memory system 900 housed in a computer unit 1015. Computer system 1000 is but one example of an electronic system containing another electronic system, i.e. memory system 900, as a sub-component. The computer system 1000 can contain an input/output (I/O) circuit 1020 that is coupled to the processor 1010 and the memory system 900. Computer system 1000 optionally contains user interface components that are coupled to the I/O circuit 1020. In accordance with the present invention a plurality of BDL structures can be coupled to one of a plurality of I/O pads or pins 1030 of the I/O circuit 1020. The I/O circuit 1020 can then be coupled a monitor 1040, a printer 1050, a bulk storage device 1060, a keyboard 1070 and a pointing device 1080. It will be appreciated that other components are often associated with computer system 1000 such as modems, device driver cards, additional storage devices, etc. It will further be appreciated that the processor 1010, memory system 900, I/O circuit 1020 and partially isolated structures or data storage devices of computer system 1000 can be incorporated on a single integrated circuit. Such single package processing units reduce the communication time between the processor 1010 and the memory system 1000.

CONCLUSION

Thus has been shown a structure including three films that are used in a buried digit line. The BDL structure includes a large-grained metal film that achieves a lowered resistivity in accordance with improved resistivity needs. The BDL structure can be fabricated in a single PVD tool such that no more than a single tool-prep is required. According to the structure itself, nitrogen migration is delayed such that a salicide film is grown without significant nitrogen incursion.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate embodiment.

While various embodiments have been described and illustrated with respect to forming buried digit line structures, it should be apparent that the same processing techniques can be used to form other structures by the stacked film techniques set forth in this disclosure for other applications. Furthermore, the processes described herein may be used in the development of other three-dimensional semiconductor structures, as well as in the development of other semiconductor structures, such as gates, interconnects, contact pads, and more.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A buried digit line structure comprising:
   a conductive plug coupled to a substrate, wherein the conductive plug includes a characteristic dimension;
   a salicide first film above the conductive plug;
   a refractory metal silicide nitride second film above the salicide first film; and
   a refractory metal third film above the refractory metal silicide nitride second film, wherein the refractory metal third film includes an average grain size that is in a range from about one-tenth the conductive plug characteristic dimension to larger than the conductive plug characteristic dimension.

2. The buried digit line structure according to claim 1, wherein the conductive plug characteristic dimension is in a range from about a 0.25 micron geometry to about a 0.11 micron geometry.

3. The buried digit line structure according to claim 1, wherein salicide first film has a thickness from about 30 Å to about 300 Å, wherein the refractory metal silicide nitride second film has a thickness from about 50 Å to about 500 Å, and wherein the refractory metal third film has a thickness from about 30 Å to about 3,000 Å.

4. The buried digit line structure according to claim 1, wherein salicide first film has a thickness of about 130 Å, wherein the refractory metal silicide nitride second film has a thickness of about 100 Å, and wherein the refractory metal third film has a thickness of about 350 Å.

5. The buried digit line structure according to claim 1, wherein the salicide first film is $MSi_2$, wherein M is selected from Ta, W, Mo, Hf, Ti, $TaTi_x$, $WTi_x$, $MoTi_x$, $HfTi_x$, $TaW_x$, $Ta_yW_zTi_x$, $Ta_xMo$, $Ta_yMo_zTi_x$, $Ta_xHf$, $Ta_yHf_zTi_x$, $W_xTi$, $W_yMo$, $W_yMo_zTi_x$, $W_xHf$, $W_yHf_zTi_x$, $Mo_xHf$, and $Mo_yHf_zTi_x$, wherein $0.001 \leq x \leq 0.99$, wherein $0.2 \leq y \leq 0.9$, and wherein $0.1 \leq z \leq 0.8$.

6. The buried digit line structure according to claim 5, wherein the refractory metal silicide nitride second film is selected from $TaN_pSi_q$, $WN_pSi_q$, $MoN_pSi_q$, $HfN_pSi_q$, and combinations thereof wherein and $0 < q \leq 2.5$, and wherein $0 < p \leq 1$.

7. The buried digit line structure according to claim 1, wherein the salicide first film is selected from $TaSi_2$, $WSi_2$, $MoSi_2$, $HfSi_2$, and combinations thereof, wherein the refractory metal silicide nitride second film is selected from $TaN_ySi_x$, $WN_ySi_x$, $MoN_ySi_x$, $HfN_ySi_x$, and combinations thereof wherein and $0 < x \leq 2.5$, and wherein $0 < y \leq 1$.

8. The buried digit line structure according to claim 1, wherein the refractory metal third film includes a resistivity in a range from about 0.1 Ω/sq to about 1,000 Ω/sq.

9. A buried digit line structure comprising:
   a conductive plug coupled to a substrate, wherein the conductive plug includes a characteristic dimension;
   a salicide first film above the conductive plug;
   a titanium nitride second film above the salicide first film; and
   a refractory metal third film above the titanium nitride second film, wherein the refractory metal third film includes an average grain size that is in a range from about one-tenth the conductive plug characteristic dimension to larger than the conductive plug characteristic dimension.

10. The buried digit line structure according to claim 9, wherein the conductive plug characteristic dimension is in a range from about a 0.25 micron geometry to about a 0.11 micron geomretry.

11. The buried digit line structure according to claim 9, wherein the salicide first film has a thickness from about 30

Å to about 300 Å, wherein the titanium nitride second film has a thickness from about 25 Å to about 500 Å, and wherein the refractory metal third film has a thickness from about 30 Å to about 3,000 Å.

12. The buried digit line structure according to claim 9, wherein the salicide first film has a thickness of about 130 Å, wherein the titanium nitride second film has a thickness of about 100 Å, and wherein the refractory metal third film has a thickness of about 350 Å.

13. The buried digit line structure according to claim 9, wherein the salicide first film is $MSi_2$, wherein M is selected from Ta, W, Mo, Hf, Ti, $TaTi_x$, $WTi_x$, $MoTi_x$, $HfTi_x$, $TaW_x$, $Ta_yW_zTi_x$, $Ta_xMo$, $Ta_yMo_zTi_x$, $Ta_xHf$, $Ta_yHf_zTi_x$, $W_xTi$, $W_xMo$, $W_yMo_zTi_x$, $W_xHf$, $W_yHf_zTi_x$, $Mo_xHf$, and $Mo_yHf_zTi_x$, wherein $0.001 \leq x \leq 0.99$, wherein $0.2 \leq y \leq 0.9$, and wherein $0.1 \leq z \leq 0.8$.

14. The buried digit line structure according to claim 9, wherein the refractory metal third film includes a resistivity in a range from about 0.1 $\Omega$/sq to about 1,000 $\Omega$/sq.

15. An electrical device comprising:
   a conductive plug coupled to a substrate, wherein the conductive plug includes a characteristic dimension;
   a salicide first film above the conductive plug;
   a refractory metal compound second film above the salicide first film; and
   a refractory metal third film above the refractory metal compound second film, wherein the refractory metal third film includes an average grain size that is in a range from about one-tenth the conductive plug characteristic dimension to larger than the conductive plug characteristic dimension.

16. The electrical device according to claim 15, wherein the refractory metal compound second film is selected from titanium nitride, and a refractory metal nitride silicide.

17. The electrical device according to claim 15, wherein the refractory metal third film includes a resistivity in a range from about 0.1 $\Omega$/sq to about 1,000 $\Omega$/sq.

18. The electrical device according to claim 15, wherein the electrical device further includes:
   a chip package, wherein the substrate is disposed in the chip package.

19. The electrical device according to claim 15, wherein the electrical device further includes:
   a chip package, wherein the substrate is disposed in the chip package; and
   a host, wherein the chip package is disposed in the host.

20. The electrical device according to claim 15, wherein the electrical device further includes:
   a chip package, wherein the substrate is disposed in the chip package; and
   a host, wherein the chip package is disposed in the host, wherein the host includes a memory module.

21. The electrical device according to claim 15, wherein the electrical device further includes:
   a chip package, wherein the substrate is disposed in the chip package; and
   a host, wherein the chip package is disposed in the host, wherein the host includes a memory module; and
   an electronic system, wherein the memory module is disposed in the electronic system.

22. The electrical device according to claim 15, wherein the electrical device further includes:
   a chip package, wherein the substrate is disposed in the chip package;
   a host, wherein the chip package is disposed in the host, wherein the host includes a dynamic random access memory module; and
   an electronic system, wherein the dynamic random access memory module is disposed in the electronic system.

23. The electrical device according to claim 15, wherein the electrical device further includes:
   a chip package, wherein the substrate is disposed in the chip package;
   a host, wherein the chip package is disposed in the host; and
   an electronic system, wherein the host is disposed in the electronic system.

24. A computer system, comprising:
   a processor;
   a memory system coupled to the processor;
   an input/output (I/O) circuit coupled to the processor and the memory system; and
   a buried digit line structure disposed in the processor or the memory system, the buried digit line structure including:
      a conductive plug coupled to a substrate, wherein the conductive plug includes a characteristic dimension;
      a salicide first film above the conductive plug;
      a refractory metal compound second film above the salicide first film; and
      a refractory metal third film above the refractory metal compound second film, wherein the refractory metal third film includes an average grain size that is in a range from about one-tenth the conductive plug characteristic dimension to larger than the conductive plug characteristic dimension.

25. The computer system according to claim 24, wherein the processor is disposed in a host selected from a clock, a television, a cell phone, a personal computer, an automobile, an industrial control system, an aircraft, and a hand-held.

26. The computer system according to claim 24, wherein the memory system is disposed in a host selected from a clock, a television, a cell phone, a personal computer, an automobile, an industrial control system, an aircraft, and a hand-held.

27. The computer system according to claim 24, wherein the refractory metal third film includes a resistivity in a range from about 0.1 $\Omega$/sq to about 1,000 $\Omega$/sq.

* * * * *